United States Patent [19]
Katoh

[11] Patent Number: 6,025,266
[45] Date of Patent: Feb. 15, 2000

[54] VACUUM FILM FORMATION METHOD AND DEVICE

[75] Inventor: Hiroyuki Katoh, Tokyo, Japan

[73] Assignee: NEC Corporation, Tokyo, Japan

[21] Appl. No.: 08/922,647

[22] Filed: Sep. 3, 1997

[30] Foreign Application Priority Data

Sep. 4, 1996 [JP] Japan ................................. 8-234055

[51] Int. Cl.[7] .................................................. H01L 21/44
[52] U.S. Cl. .......................... 438/653; 438/648; 438/656;
118/715; 118/719; 118/729; 204/298.11
[58] Field of Search ..................... 438/653, 656,
438/648; 118/715, 719, 729; 204/298.11

[56] References Cited

FOREIGN PATENT DOCUMENTS

| | | |
|---|---|---|
| 1-200625 | 8/1989 | Japan . |
| 6-29241 | 2/1994 | Japan . |
| 7-245300 | 9/1995 | Japan . |
| 8-51087 | 2/1996 | Japan . |
| 9-205130 | 8/1997 | Japan . |

*Primary Examiner*—Caridad Everhart
*Attorney, Agent, or Firm*—Foley, Hoag & Eliot LLP

[57] ABSTRACT

A vacuum film formation device is proposed in which when forming TiN/Ti films before forming a W film, the W film is prevented from peeling, the Ti film can be formed on all the surfaces of a wafer, and a chamber can be alternately used for forming the TiN film or the Ti film, thereby enlarging the film-forming effective area and improving the productivity. For this purpose, a drive mechanism 1 of a cover shield 2 is provided in a vacuum device chamber. When the films are formed, the vertical position of the cover shield 2 is changed by the drive mechanism 1 when forming the TiN film and when forming the Ti film, respectively.

12 Claims, 3 Drawing Sheets

VACUUM FILM FORMATION METHOD AND DEVICE

BACKGROUND OF THE INVENTION

1. Field of the Invention

The present invention relates to a film formation technique, and particularly relates to a film formation method and device, in which the formation of films on the backside of a wafer can be controlled.

2. Description of the Prior Art

Heretofore, a film formation method and device, in which Ti, TiN and W films are sequentially formed on the surface of a wafer, have been developed. For example, the following prior arts are known.

FIG. 1A diagrammatically shows an example of the prior-art film formation mechanism, and FIG. 1B shows another example thereof.

The prior art shown in FIG. 1A is disclosed in the Japanese Patent Application Laid-open No. 29241/1994. After a polysilicon film 33 is formed on an interlayer insulating film 31, a Ti film and a TiN film 35 are sequentially sputtered. In this case, the peripheral part of a wafer is supported with a clamp. After annealing, a blanket tungsten film 38 is formed. Since the blanket tungsten film 38 is formed on the polysilicon film 33, the peeling of the blanket tungsten film 38 can be prevented: otherwise, the blanket tungsten film 38 would peel off because the blanket tungsten film 38 has a bad adhesion to the interlayer insulating film 31. A titanium silicide film 37 is formed by reaction of the Ti film and the polysilicon film 33. Number 30 refers to a silicon wafer.

The prior art shown in FIG. 1B is disclosed in the Japanese Patent Application Laid-open No. 32563/1992. Both the TiN film having a large tendency to peeling and the Ti film 43 having a small tendency to peeling are formed by varying sputtering gas in a chamber 41. Particles are thus decreased in the chamber 41. Number 42 denotes a substrate holder, 44 denotes a target, 45 denotes a shutter sheet, 48 denotes a high frequency power source, 49 denotes a gas introduction system, 50 denotes an argon gas bomb, 52 denotes a nitrogen gas bomb, and 54 denotes a substrate.

The first problem with the prior art is that the effective area is reduced because the peripheral part is supported with the clamp.

The second problem is that when the TiN film and the Ti film are formed in the same film formation device, it cannot be assured that the Ti film is completely covered with the TiN film, and no margin is allowed. This is because the formation of the film on the sides and backside of the wafer cannot be controlled.

After forming the TiN/Ti films, the tungsten (W) film is formed. In this case, if the Ti film is incompletely covered with the TiN film, the W film reacts and peels. In the prior art, to avoid the peeling, when forming the Ti and TiN films, the chamber is fixed, and when forming the Ti film, the chamber is clamped, thereby preventing the Ti film from reaching the backside of the wafer. Therefore, the efficiency of maintenance is decreased for the reasons: (1) reduction of the film formation effective area; and (2) fixing of the film formation chamber.

SUMMARY OF THE INVENTION

Wherefore, an object of the present invention is to provide a vacuum film formation method and device, in which when the TiN/Ti films are formed before the W film is formed, the W film is prevented from peeling, the Ti film is formed on all the surfaces of the wafer, and chambers are alternately used when forming the TiN film and when forming the Ti film. Therefore, the film-forming effective area can be enlarged and the productivity is improved.

To attain this or other objects, the present invention provides a vacuum film formation method of forming a Ti film on a wafer before forming a TiN film, in which the TiN film forming area is larger than the Ti film forming area at the peripheral part of the wafer.

Also in the present invention, the position of a cover shield in a vacuum device chamber is changed when forming the TiN film and when forming the Ti film on the wafer, respectively.

Also in the present invention, the distance between the wafer and the cover shield when forming the Ti film is shorter than the distance between the wafer and the cover shield when forming the TiN film.

Also in the present invention, a measure is provided for varying the film-forming area on the backside of the wafer.

Also in the present invention, the outer configuration of a wafer holder is smaller than the outer diameter of the wafer, and the outer configuration of the cover shield is larger than the outer diameter of the wafer.

Further in the present invention, the drive mechanism of the cover shield is provided in the vacuum device chamber for changing the position of the cover shield when forming the TiN film and when forming the Ti film, respectively.

Further in the present invention, the drive mechanism of the cover shield is a vertically driven mechanism for changing the vertical position of the cover shield when forming the TiN film and when forming the Ti film, respectively.

DETAILED DESCRIPTION OF THE PREFERRED EMBODIMENT(S)

Figure 1A:
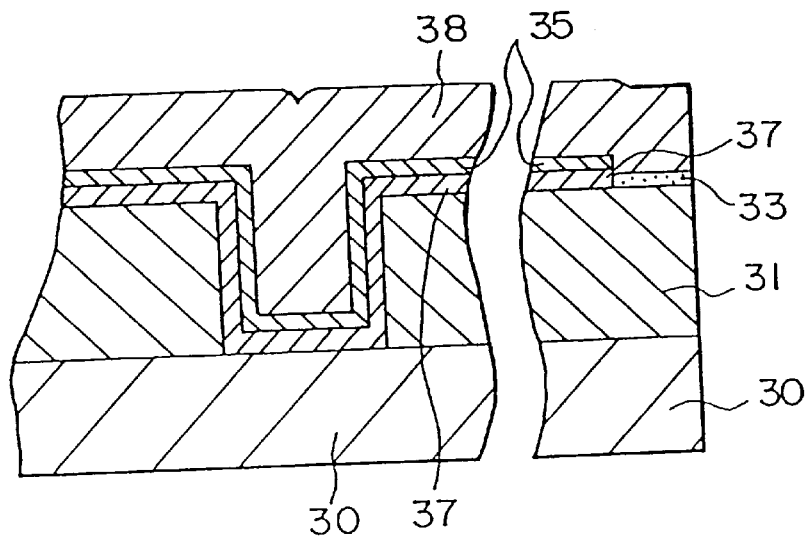
FIG. 1A shows an example of prior-art vacuum film formation mechanism.
Figure 1B:
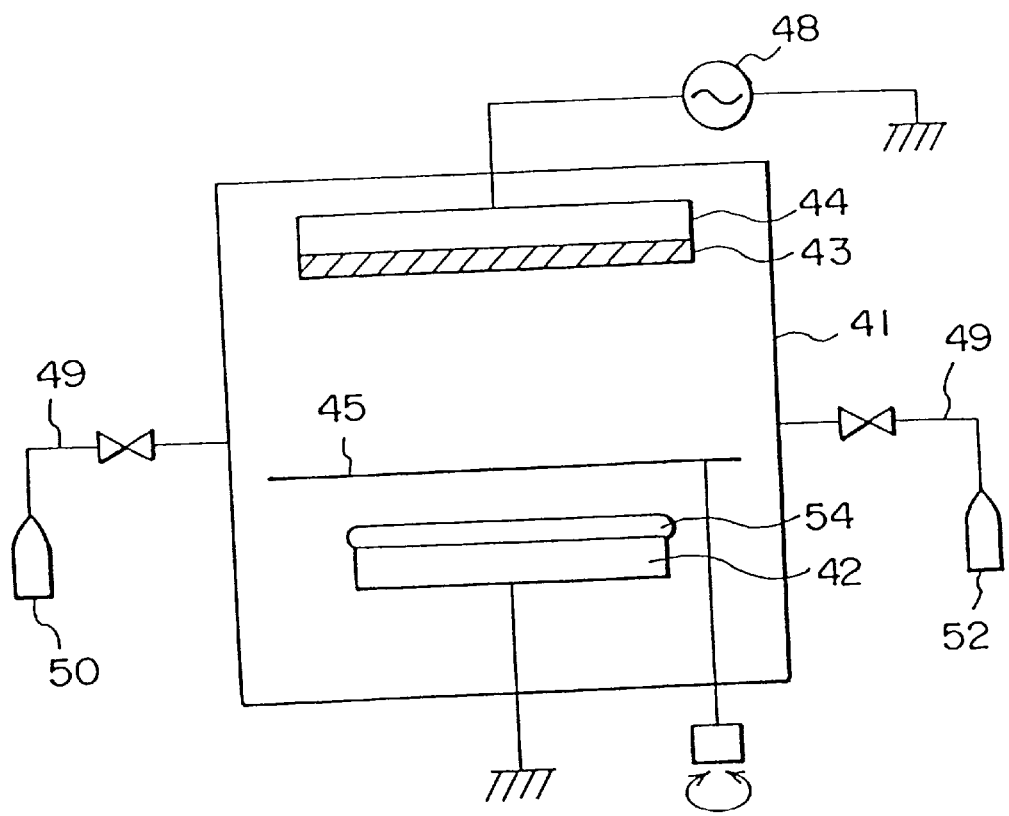
FIG. 1B shows another example of prior-art vacuum film formation mechanism.
Figure 2:
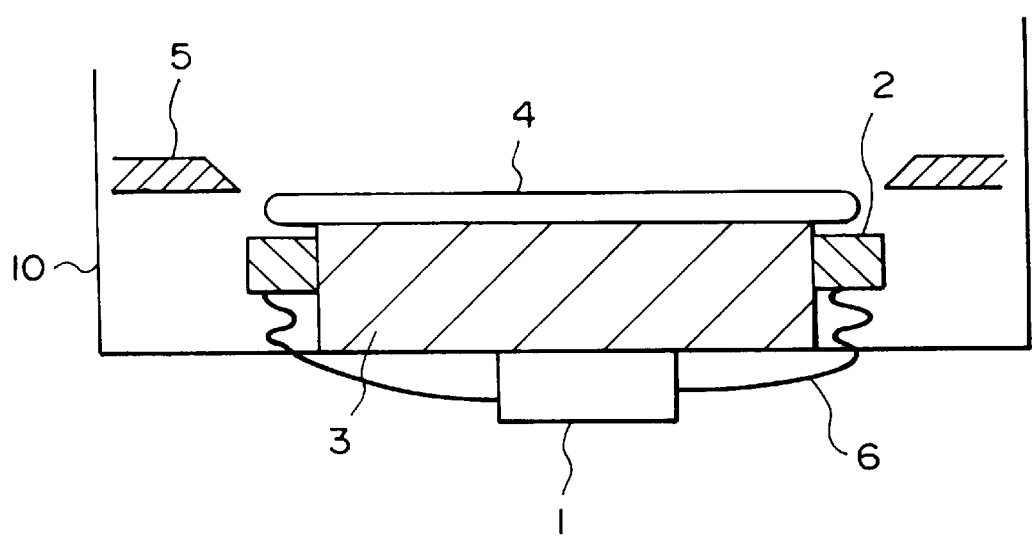
FIG. 2 is a schematic diagram showing a vacuum film formation device provided with the mechanism for vertically moving a cover shield embodying the present invention.
Figure 3A:
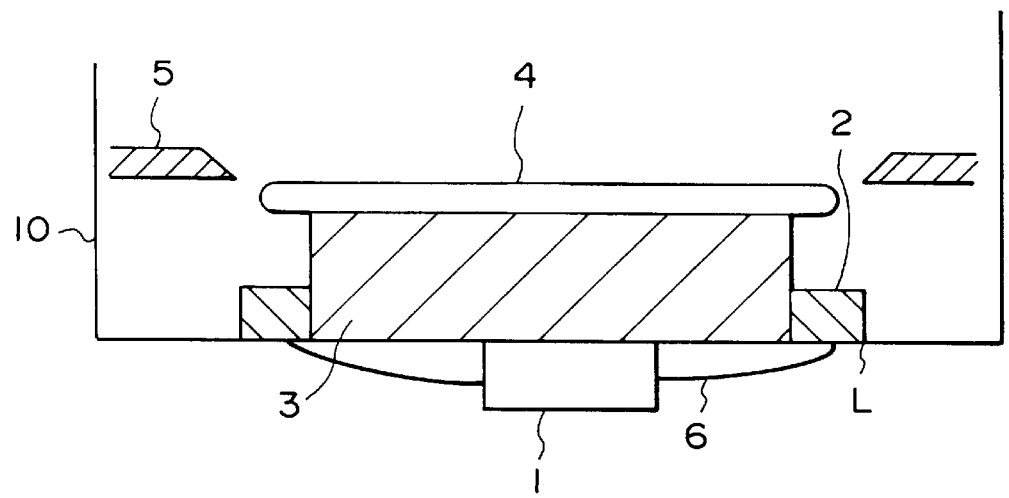
FIG. 3A shows the TiN film forming structure of the vacuum film formation device according to the present invention.
Figure 3B:
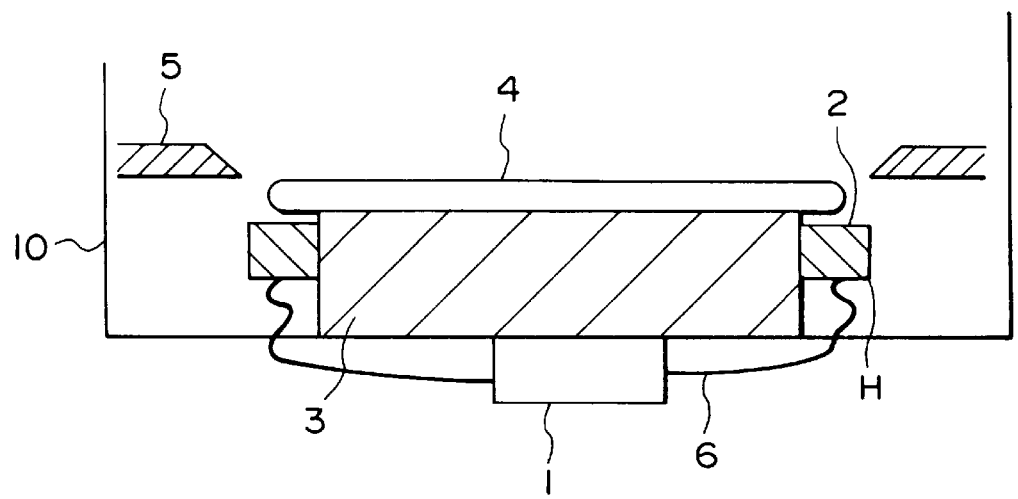
FIG. 3B shows the Ti film forming structure of the vacuum film formation device according to the present invention.

FIG. 2 is a diagrammatic representation showing the vacuum film formation device provided with a vertically operable mechanism for moving a cover shield according to the present invention, FIG. 3A shows the TiN film forming structure of the vacuum film formation device of the present invention, and FIG. 3B shows the Ti film forming structure of the same device.

In FIG. 2, 1 denotes a cover shield controller, 2 denotes a cover shield, 3 denotes a holder for supporting a wafer 4, 5 denotes a ring chuck, 6 denotes the bellows connected with the cover shield 2, and 10 denotes a vacuum film formation chamber.

According to the present invention, the cover shield controller 1 is provided for vertically moving the cover shield 2 in the film-forming chamber 10. By changing the vertical position of the cover shield 2 when forming the TiN film (FIG. 3A) and when forming the Ti film (FIG. 3B), respectively, the turning of the films to the wafer backside is controlled when forming the films. Therefore, the Ti film can be formed on all the surfaces of the wafer, and the Ti film can be completely covered with the TiN film.

According to the present invention, when forming the TiN film, as shown in FIG. 3A, the stop position of the cover shield 2 is set at the lower limited position, and the distance between the wafer and the cover shield is maximized, thereby enlarging the film-forming area on the wafer backside.

On the other hand, when forming the Ti film, as shown in FIG. 3B, the stop position of the cover shield 2 is set at the upper limited position, and the distance between the wafer and the cover shield is minimized, thereby reducing the film-forming area of the wafer backside.

Therefore, the Ti film can be completely covered with the TiN film.

In the present invention, as shown in FIG. 2, the vertically operable cover shield 2 and the cover shield controller 1 for controlling the cover shield 2 are provided in the vacuum film formation chamber 10. As shown in FIGS. 3A and 3B, the position of the cover shield 2 is changed when forming the TiN film and when forming the Ti film, respectively, for controlling the turning of the film onto the backside of the wafer. When the cover shield 2 is positioned at an upper limited stop position H as shown in FIG. 3B, the backside of the wafer is less covered with the film. On the other hand, when the cover shield 2 is positioned at a lower limited stop position L as shown in FIG. 3A, the backside of the wafer is largely covered with the film. Therefore, the Ti film can be formed on all the surfaces of the wafer, and the Ti film can be completely covered with the TiN film. Therefore, even when the W film is formed on all the surfaces of the wafer, the W film is prevented from peeling.

The operation for practicing the present invention is as follows:

(1) As shown in FIG. 3B, the cover shield 2 is stopped at the upper limited stop position H, and the Ti film is formed (formation of the film on all the surfaces of the wafer).

(2) Subsequently, as shown in FIG. 3A, the cover shield 2 is stopped at the lower limited stop position L, and the TiN film is formed (formation of the film on all the surfaces of the wafer).

(3) Finally, the W film is formed (formation of the film on all the surfaces of the wafer).

Next, the embodiment of the present invention will be described.

As shown in FIG. 2, the cover shield 2 having the thickness of about 5 mm is moved vertically by the cover shield controller 1. By adjusting the quantity of gas supplied to the bellows 6 connected with the cover shield controller 1, the cover shield 2 can be vertically moved or stopped.

As shown in FIG. 3B, the cover shield 2 is stopped at the upper limited stop position H when forming the Ti film. The distance between the wafer 4 and the cover shield 2 is made about 1 mm to 2 mm.

Also, as shown in FIG. 3A, the cover shield 2 is stopped at the lower limited stop position L when forming the TiN film. The distance between the wafer 4 and the cover shield 2 is made about 20 mm to 50 mm.

In this case, the distance by which the wafer 4 is protruded from the holder 3 is 5 mm, the width of the cover shield 2 is about 3 mm to 5 mm, and the distance between the wafer 4 and the ring chuck 5 is about 3 mm to 5 mm.

As aforementioned, according to the present invention, in the vacuum film formation method, after the Ti film is formed on the wafer, the TiN film is formed. In the method, the TiN film forming area is larger than the Ti film forming area at the peripheral part of the wafer. Therefore, the following effects are obtained.

(1) The Ti film can be completely covered with the TiN film on all the surfaces of the wafer. Therefore, the Ti film and the W film can be formed on all the surfaces of the wafer without peeling the W film.

(2) When forming the Ti film and the TiN film in one chamber, either the Ti film or the TiN film can be formed on the all the surfaces of the wafer without peeling the W film. The chamber does not have to be fixed. Specifically, the chamber can be used in common when forming the Ti and TiN films. Alternatively, chambers can be alternately used for forming the Ti and TiN films.

What is claimed is:

1. A vacuum film formation method comprising:

placing a wafer on a wafer holder having an outer periphery with an outside diameter that is smaller than an outside diameter of the wafer;

moving a shield that has an outer diameter larger than the outside diameter of the wafer and is moveably disposed on the outer periphery of said wafer holder, to a first position proximate to the wafer;

forming a Ti film on a wafer; and forming a TiN film, in which a TiN film forming area is larger than a Ti film forming area at the peripheral part of the wafer.

2. A vacuum film formation method for forming films on a wafer, according to claim 1, in which the position of the shield in a vacuum device chamber is changed to a second position when forming the TiN film.

3. A vacuum film formation method according to claim 2, in which a first distance between the wafer and the cover shield when forming the Ti film is shorter than a second distance between the wafer and the cover shield when forming the TiN film.

4. A vacuum film formation device, comprising:

a wafer holder that accepts a wafer; and a means for varying a film-forming area, said means being disposed on a backside of a wafer provided to said wafer holder and including a cover shield moveably disposed on an outer periphery of said wafer holder.

5. A vacuum film formation device according to claim 4, in which an outer diameter of a wafer holder is smaller than an outer diameter of the wafer, and the outer configuration of the cover shield is larger than the outer diameter of the wafer.

6. A vacuum film formation device comprising:

a vacuum device chamber;

a wafer holder disposed on said vacuum device chamber;

a cover shield disposed about an outer periphery of said wafer holder; and a drive mechanism for moving said cover shield in said vacuum device chamber position when forming a TiN film and a sconIiio when forming a Ti film.

7. A vacuum film formation device according to claim 6, in which said drive mechanism of the cover shield is a vertically operable mechanism, and a vertical position of the cover shield can be changed by said drive mechanism when forming the TiN film and when forming the Ti film, respectively.

8. A vacuum film formation device, comprising:

a wafer holder for supporting a wafer provided in a vacuum film formation chamber;

a cover shield movably disposed on an outer periphery of said wafer holder; and a drive mechanism for driving said cover shield, in which a distance between said wafer and said cover shield is variable.

9. The vacuum film formation device according to claim 6, wherein a distance between the wafer and the cover shield when forming the Ti film, is shorter than the distance between the wafer holder and the cover shield when forming the TiN film.

10. A vacuum film formation method comprising:

placing a wafer on a wafer holder having an outer periphery with an outside diameter that is smaller than an outside diameter of the wafer;

moving a shield that has an outer diameter larger than an outer diameter of the wafer and is moveably disposed on the outer periphery of said wafer holder, to a first position;

depositing a first film on the wafer; and depositing a second film on the wafer, wherein a film forming area of the second film is different than a film forming area of the first film.

11. A vacuum film formation method, according to claim 10, further comprising:

after depositing said first film and prior to depositing said second film, moving the shield to a second position different from said first position.

12. A vacuum film formation method, according to claim 10, wherein the second film is a TiN film and the first film is a Ti film.

* * * * *